United States Patent
Ehm et al.

(10) Patent No.: US 9,996,005 B2
(45) Date of Patent: Jun. 12, 2018

(54) REFLECTIVE OPTICAL ELEMENT AND OPTICAL SYSTEM FOR EUV LITHOGRAPHY

(71) Applicant: CARL ZEISS SMT GmbH, Oberkochen (DE)

(72) Inventors: Dirk Heinrich Ehm, Lauchheim (DE); Peter Huber, Holzschwang (DE); Stephan Muellender, Aalen (DE); Gisela Von Blanckenhagen, Aalen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 0 days. days.

(21) Appl. No.: 14/082,865

(22) Filed: Nov. 18, 2013

(65) Prior Publication Data
US 2014/0199543 A1 Jul. 17, 2014

Related U.S. Application Data

(63) Continuation of application No. PCT/EP2012/058997, filed on May 15, 2012.

(30) Foreign Application Priority Data

May 18, 2011 (DE) .................. 10 2011 076 011

(51) Int. Cl.
*G03F 7/20* (2006.01)
*G02B 1/10* (2015.01)
(Continued)

(52) U.S. Cl.
CPC ............ *G03F 7/2008* (2013.01); *B82Y 10/00* (2013.01); *G02B 1/105* (2013.01); *G02B 5/0816* (2013.01);
(Continued)

(58) Field of Classification Search
CPC .... G02B 1/105; G02B 5/0816; G02B 5/0891; G02B 19/0095; G02B 27/0006;
(Continued)

(56) References Cited

U.S. PATENT DOCUMENTS 6,724,462 B1    4/2004   Singh et al.
7,382,527 B2 *  6/2008   Kandaka ............... B82Y 10/00
                                                   359/359

(Continued)

FOREIGN PATENT DOCUMENTS

DE        10258709 A1    7/2004
DE     102008007387 A1    8/2008
(Continued)

OTHER PUBLICATIONS

International Search Report for PCT/EP2012/058997 dated Jul. 19, 2012.
(Continued)

*Primary Examiner* — Jonathan C Langman
(74) *Attorney, Agent, or Firm* — Edell, Shapiro & Finnan, LLC (57) ABSTRACT

In order to reduce the negative influence of reactive hydrogen on the lifetime of a reflective optical element, particularly inside an EUV lithography device, there is proposed for the extreme ultraviolet and soft X-ray wavelength region a reflective optical element (50) having a reflective surface (60) with a multilayer system (51) and in the case of which the reflective surface (60) has a protective layer system (59) with an uppermost layer (56) composed of silicon carbide or ruthenium, the protective layer system (59) having a thickness of between 5 nm and 25 nm.

17 Claims, 3 Drawing Sheets (51) Int. Cl.
*G02B 5/08* (2006.01)
*G02B 19/00* (2006.01)
*G02B 27/00* (2006.01)
*G21K 1/06* (2006.01)
*B82Y 10/00* (2011.01)

(52) U.S. Cl.
CPC ....... *G02B 5/0891* (2013.01); *G02B 19/0095* (2013.01); *G02B 27/0006* (2013.01); *G03F 7/2004* (2013.01); *G03F 7/70316* (2013.01); *G03F 7/70916* (2013.01); *G03F 7/70958* (2013.01); *G21K 1/062* (2013.01); *G21K 2201/067* (2013.01); *Y10T 428/265* (2015.01)

(58) Field of Classification Search
CPC ............. G03F 7/70316; G03F 7/70958; G03F 7/2008; G03F 7/2004; G03F 7/70916; G21K 1/062; G21K 2201/067; B82Y 10/00; Y10T 428/265

See application file for complete search history.

(56) References Cited

U.S. PATENT DOCUMENTS

| | | |
|---|---|---|
| 2002/0012797 A1 | 1/2002 | Bijkerk et al. |
| 2003/0008180 A1 | 1/2003 | Bajt et al. |
| 2004/0002009 A1* | 1/2004 | Yan ................ B82Y 10/00 430/5 |
| 2004/0061930 A1 | 4/2004 | Wedowski |
| 2004/0105083 A1 | 6/2004 | Kurt et al. |
| 2004/0121134 A1 | 6/2004 | Bijkerk et al. |
| 2005/0276988 A1 | 12/2005 | Trenkler |
| 2006/0160034 A1* | 7/2006 | Wurm ................ B82Y 10/00 430/330 |
| 2006/0237303 A1 | 10/2006 | Hosoya et al. |
| 2008/0149854 A1 | 6/2008 | Marinus Johannes et al. |
| 2010/0027107 A1 | 2/2010 | Yakshin et al. |
| 2010/0033702 A1 | 2/2010 | Rigato |
| 2010/0149512 A1* | 6/2010 | Van Herpen et al. .......... 355/71 |
| 2010/0238422 A1 | 9/2010 | Zink et al. |

FOREIGN PATENT DOCUMENTS

| | | |
|---|---|---|
| JP | 2001059901 A | 3/2001 |
| JP | 2010532554 A | 10/2010 |
| WO | 2008/148516 A2 | 12/2008 |
| WO | 2011/039061 A1 | 4/2011 |

OTHER PUBLICATIONS

Office Action in corresponding Chinese Application No. 201280024078.6, dated Jan. 12, 2015, along with an English translation.
Office Action in corresponding Chinese Application No. 201280024078.6, dated Jun. 3, 2016, along with an English translation.
Office Action in corresponding German Application No. 102011076011.3, dated May 3, 2012, along with an English translation.
Office Action in corresponding Chinese Application No. 201280024078.6, dated Oct. 19, 2015, along with an English translation.
Office Action in corresponding Japanese Application No. 2014-510773, dated Mar. 4, 2016, along with an English translation.
Office Action in corresponding Japanese Application 2014510773, dated Jan. 13, 2017, along with English Translation.
Office Action in corresponding Chinese Application 201280024078.6, dated Feb. 3, 2017, along with English Translation.

* cited by examiner

Fig. 3

REFLECTIVE OPTICAL ELEMENT AND OPTICAL SYSTEM FOR EUV LITHOGRAPHY

The present application is a Continuation of International Application No. PCT/EP2012/058997, filed on May 15, 2012, which claims priority of German Patent Application No. 10 2011 076 011.3, filed on May 18, 2011, and U.S. Provisional Application No. 61/487,402, filed on May 18, 2011. The disclosures of these three applications are hereby incorporated herein by reference in their respective entireties.

FIELD OF AND BACKGROUND OF THE INVENTION

The present invention relates to a reflective optical element for the extreme ultraviolet and soft X-ray wavelength region having a reflective surface with a multilayer system. Moreover, the present invention relates to an optical system for EUV lithography with such a reflective optical element.

For the lithography of semiconductor components, in EUV lithography devices use is made of reflective optical elements for the extreme ultraviolet (EUV) and soft X-ray (SX) wavelength region (for example wavelengths of between approximately 5 nm and 20 nm) such as, for example, photomasks or mirrors on the basis of multilayer systems. Since EUV lithography devices generally have a plurality of reflective optical elements, these elements must have as high a reflectivity as possible in order to ensure a sufficiently high total reflectivity. The reflectivity and the service life of the reflective optical elements can be reduced by contamination of the optically used reflective surface of the reflective optical elements. This contamination results from the shortwave irradiation together with residual gases in the operating atmosphere. Since a plurality of reflective optical elements are usually arranged one behind another in an EUV lithography device, even relatively small amounts of contaminations on each individual reflective optical element affect the total reflectivity to a relatively great extent.

Contamination can occur, for example, because of moisture residues. In this case, water molecules are dissociated by the EUV and/or SX radiation, and the resulting free oxygen radicals oxidize the optically active surfaces of the reflective optical elements. A further source of contamination is polymers. These can, for example, originate from the vacuum pumps used in EUV lithography devices or from residues of photoresists that are used on the semiconductor substrates to be patterned, and can lead, under the influence of the operating radiation, to carbon contaminations on the reflective optical elements. Whereas oxidative contaminations are generally irreversible, it is possible, in particular, to remove carbon contaminations through, inter alia, treatment with reactive hydrogen by having the reactive hydrogen react with the carbon containing residues to form volatile compounds. Reactive hydrogen can be hydrogen radicals or else ionized hydrogen atoms or molecules.

However, it has been observed that under the influence of reactive hydrogen that is used for cleaning, or because of the interaction of the EUV and/or SX radiation with hydrogen present in the residual atmosphere, it is possible that individual layers, in particular those right at the surface of the multilayer system, can become detached. It is thought that the hydrogen, for example in silicon layers, reacts to form silane compounds.

OBJECTS AND SUMMARY OF THE INVENTION

It is therefore an object of the present invention to provide a reflective optical element that can be used in EUV lithography even in the presence of reactive hydrogen.

This object is achieved by a reflective optical element for the extreme ultraviolet and soft X-ray wavelength region having a reflective surface with a multilayer system, wherein the reflective surface has a protective layer system with an uppermost layer composed of silicon carbide or ruthenium, the protective layer system having a thickness of between 5 nm and 25 nm.

It has been recognized by the inventors that the provision of such a protective layer system protects the multilayer system arranged thereunder, in particular against reactive hydrogen with a kinetic energy of a few hundred electron volts that would otherwise penetrate a plurality of nanometers into the multilayer system and could lead there to a detachment of the uppermost layers. What is meant by uppermost layers are the layers adjacent to the vacuum or the surroundings of the reflective optical element. It is thought that, in particular, this high energy hydrogen is decelerated in the protective layer system. In particular, starting from a protective layer system thickness of 5 nm, the quantity of the high energy reactive hydrogen that penetrates into the uppermost layers of the multilayer system lying thereunder is reduced such that the detachment of the uppermost layers of the multilayer system is observed only seldomly even in the case of lengthy use in an installation for EUV lithography.

The thicker the protective layer system, the better is the protection against reactive hydrogen, since this additionally hampers the diffusion of low energy reactive hydrogen, with kinetic energies that can be as low as only a few electron volts, into the uppermost layers of the multilayer system. On the other hand, the maximum reflectivity of the respective reflective optical element must still suffice for use in EUV lithography, thus rendering protective layer thicknesses of more than 25 nm disadvantageous.

Silicon carbide and ruthenium have proved to be particularly suitable as uppermost layer, i.e. as the layer that closes off from the surroundings or the vacuum, of the protective layer system, since they have proved to be inert to reactive hydrogen. Moreover, it has been found with silicon carbide, in particular, that the likelihood of a deposition of tin and tin compounds as well as metal hydride compounds, in general, is particularly low. This is particularly advantageous given the use of the reflective optical element in the surroundings of tin-plasma EUV radiation sources, since fewer tin impurities of the reflective surface occur. It has, moreover, become evident that an uppermost layer composed either of silicon carbide or of ruthenium is more effective at suppressing the radiation in the wavelength region between 300 nm and 100 nm which is emitted, in particular, in addition to the EUV and SX radiation by plasma radiation sources, than are conventional reflective optical elements without the protective layer system proposed here. This is advantageous, in particular, for the use of the reflective optical elements in EUV lithography, where this radiation in the ultraviolet wavelength region could otherwise lead to incorrect exposures of a wafer coated with photoresist, since conventional photoresists react not only to EUV, but also to UV radiation.

In a preferred embodiment, the protective layer system consists of an uppermost layer composed of silicon carbide or ruthenium having a thickness from 5 nm to 25 nm. In this embodiment of a protective layer system composed of a single layer, it is particularly preferred for the uppermost layer to have a thickness between 11 nm and 19 nm, in order to ensure particularly effective protection against reactive hydrogen in conjunction with good reflectivity. Reflective optical elements with only a single, uppermost layer as protective layer system can be produced with particular ease.

In a further preferred embodiment, the protective layer system under the uppermost layer has at least two alternatingly arranged layers composed of, on the one hand, molybdenum or ruthenium and of, on the other hand, carbon, a carbide or a nitride, preferably from a material from the group of silicon carbide, silicon nitride, boron carbide and carbon. What is meant here by alternatingly arranged is that two layers of the same material are not arranged directly adjacent to one another. For this case of a protective layer system composed of a plurality of layers, it is particularly preferred that the protective layer system has a total thickness of between 10 nm and 22 nm in order to ensure a particularly effective protection against reactive hydrogen in conjunction with good reflectivity. The advantage of multilayer protective layer systems with the abovementioned materials resides in the fact that the losses in reflectivity are less by comparison with single layer protective layer systems. In particularly simple variants, the protective layer system has only one additional layer between uppermost layer and multilayer system. Given an uppermost layer composed of silicon carbide, the additional layer is composed of molybdenum or ruthenium. Given an uppermost layer composed of ruthenium, the additional layer is carbon, a carbide, preferably silicon carbide or boron carbide, or a nitride, preferably silicon nitride. In further simple variants, the protective layer system has exactly two additional layers between uppermost layer and the multilayer system.

In a particularly preferred embodiment, the protective layer system under the uppermost layer composed of silicon carbide has at least two alternatingly arranged layers composed of molybdenum and silicon carbide. In this case, the protective layer system particularly preferably has a total thickness of between 11 nm and 22 nm. A reflective optical element with such a protective layer system composed of just two materials can be produced with acceptable effort. At the same time, an optimum protection against, in particular, high energy reactive hydrogen can be achieved along with lowest possible losses with respect to the maximum reflectivity. Moreover, this reflective optical element is particularly suitable for use in EUV lithography with metal plasma radiation sources, in particular tin plasma radiation sources, since the likelihood of the contamination of the reflective surface by tin or tin compounds or metal hydrides is particularly low. Moreover, radiation in the ultraviolet wavelength region is particularly effectively suppressed.

The multilayer system advantageously has alternatingly arranged layers of a material with a lower real part of the refractive index in the extreme ultraviolet and soft X-ray wavelength region and of a material with a higher real part of the refractive index in the extreme ultraviolet and soft X-ray wavelength region, the material with higher real part of the refractive index being silicon. It has been found that layers composed of pure silicon, in particular, are particularly strongly attacked by penetrating reactive hydrogen, even when further layers composed of other material are arranged thereabove. Silicon layers, too, are effectively protected against high energy reactive hydrogen, in particular, by the protective layer system proposed here. In the case of multilayer systems with silicon as material with a higher real part of the refractive index, the material with lower real part of the refractive index is advantageously molybdenum in order to obtain high reflectivities in the wavelength region around 12.5 nm to 14.5 nm, in particular.

In a particularly preferred embodiment, the reflective optical element is designed as a collector mirror. Collector mirrors are often used in EUV lithography as the first mirror in the beam direction downstream of the radiation source, in particular plasma radiation sources, in order to collect the radiation emitted by the radiation source in various directions and reflect it in focused fashion to the subsequent mirror. Because of the high radiation intensity in the vicinity of the radiation source, molecular hydrogen present in the residual gas atmosphere is converted here with particularly high likelihood into atomic hydrogen with high kinetic energy. As a result collector mirrors in particular are subject to a particularly high risk of exhibiting detachment phenomena at the upper layers of the multilayer system resulting from penetrating reactive hydrogen. If the collector mirror is a reflective optical element for the extreme ultraviolet and soft X-ray wavelength region having a reflective surface with a multilayer system, the reflective surface has a protective layer system with an uppermost layer composed of silicon carbide or ruthenium, and the protective layer system has a thickness of between 5 nm and 25 nm, it is possible to reduce the occurrence of these detachment phenomena in conjunction with adequate reflectivity.

The object is further achieved by an optical system for EUV lithography having at least one reflective optical element as previously described.

BRIEF DESCRIPTION OF THE DRAWINGS

The present invention is explained in more detail with reference to preferred albeit exemplary embodiments in which.

DETAILED DESCRIPTION OF EXEMPLARY EMBODIMENTS

Figure 1:
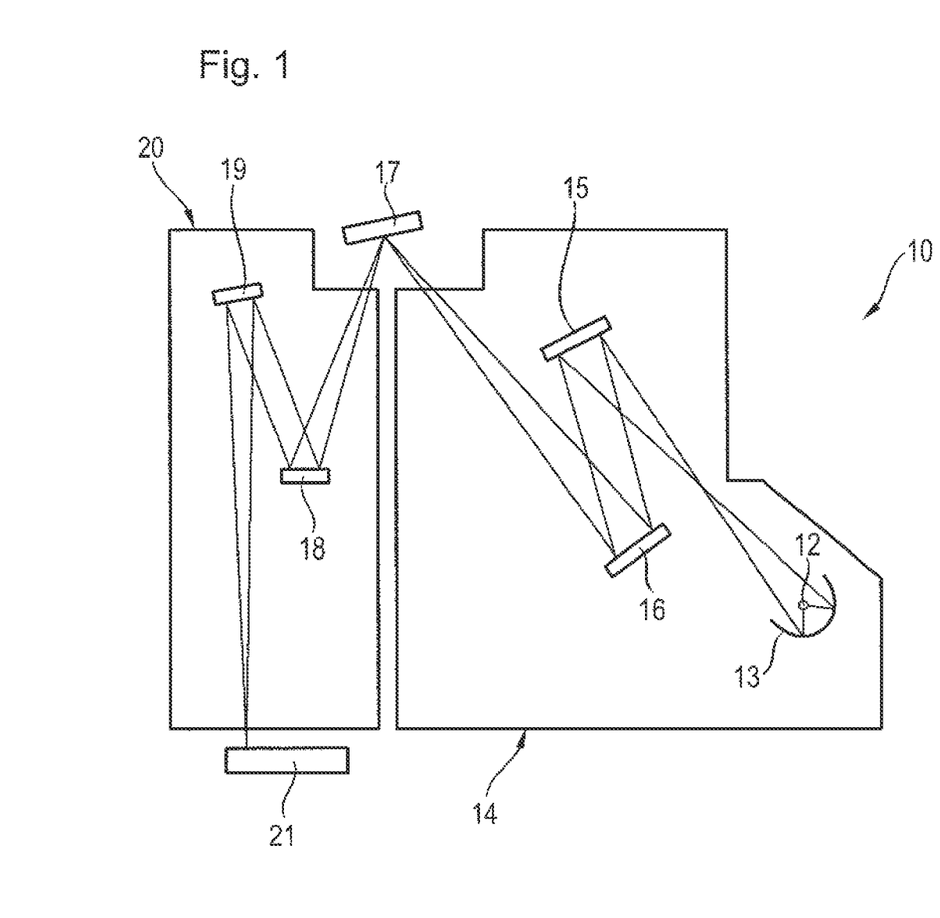
FIG. 1 is a schematic of an embodiment of an EUV lithography device having an illumination system including a collector mirror with a protective layer system.

FIG. 1 is a schematic of an EUV lithography device 10. Fundamental components are the illumination system 14, the photomask 17 and the projection system 20. The EUV lithography device 10 is operated under vacuum conditions so that the EUV radiation in its interior is absorbed as little as possible.

By way of example, the radiation source 12 can be a plasma source or else a synchrotron. In the example illustrated here it is a plasma source. The emitted radiation in the wavelength region from approximately 5 nm to 20 nm is firstly focused by the collector mirror 13. The operating beam is then introduced into the illumination system 14. In the example illustrated in FIG. 1, the illumination system 14 has two mirrors 15, 16. The mirrors 15, 16 direct the beam onto the photomask 17, which has the structure that is to be imaged onto the wafer 21. The photomask 17 is likewise a reflective optical element for the EUV and soft X-ray wavelength region that is replaced depending on the production process. The projection system 20 is used to project the beam reflected by the photomask 17 onto the wafer 21, and thereby to image the structure of the photomask onto it.

The projection system 20 has two mirrors 18, 19 in the example illustrated. It may be pointed out that both the projection system 20 and the illumination system 14 can respectively have only one or else three, four, five and more mirrors.

In order also to extend the service life of the collector mirror 13 in situations in which molecular hydrogen is present in the residual gas atmosphere of the illumination system 14 and, in particular, in the surroundings of the radiation source 12, i.e., molecular hydrogen that could be split into high energy reactive hydrogen by the radiation, or hydrogen that could originate from the cleaning of the mirrors 13, 15 or 16, and could attack the upper layers of the multilayer system of the collector mirror 13, the collector mirror 13 is equipped with a protective layer system. This protective layer system has an uppermost mirror composed of silicon carbide or ruthenium, and has a thickness of between 5 nm and 25 nm. As a result, the collector mirror 13 is protected not only against high energy reactive hydrogen, but also against tin deposits if the plasma radiation source 12 is operated on the basis of tin plasma. Furthermore, the collector mirror 13 has the advantage of largely suppressing ultraviolet radiation emitted by the radiation source 12. Consequently, the collector mirror also serves the function of a spectral filter. It may be pointed out that it is also possible to equip any other desired mirrors of the EUV lithography device 10 or its optical systems 14, 20 with a protective layer system as described in more detail below, alternatively or in addition to the collector mirror.

Figure 2A:
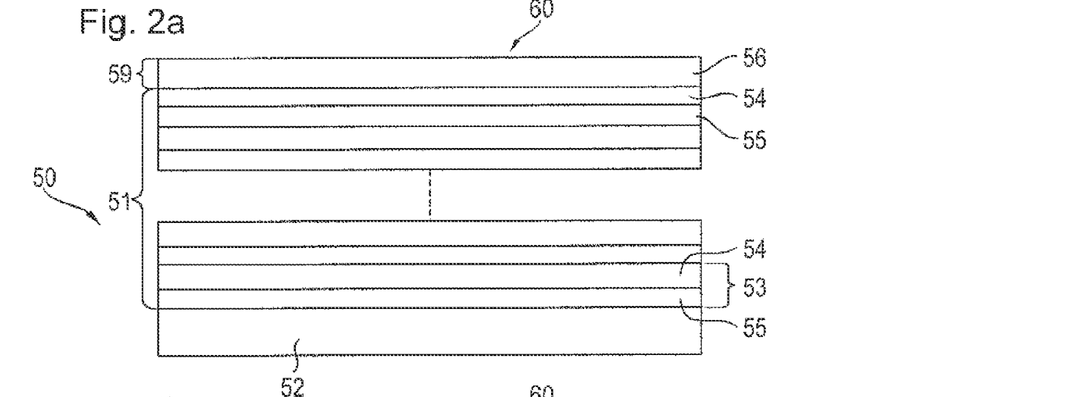
FIGS. 2a-c are schematics of various embodiments of reflective optical elements.
Figure 2B:
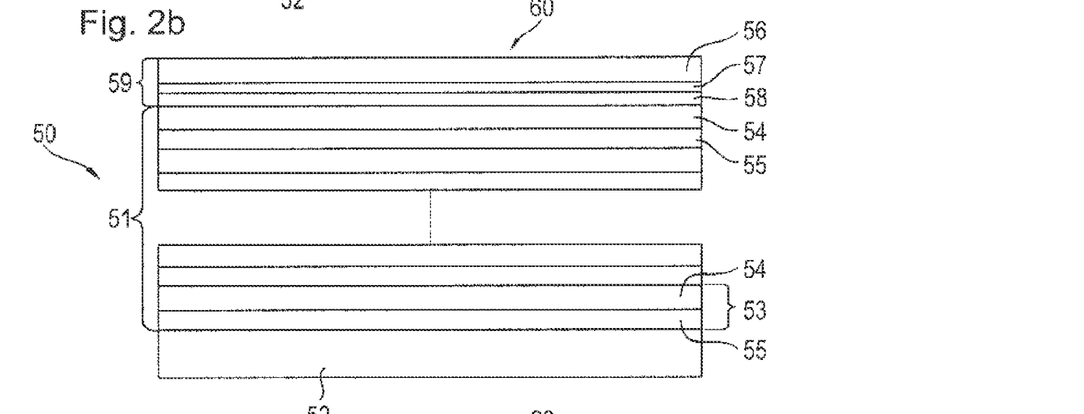

FIGS. 2a-b are schematics of the structure of exemplary embodiments of reflective optical elements 50 having protective layer systems 59. The examples illustrated are reflective optical elements based on a multilayer system 51. In these embodiments, layers of a material with a higher real part of the refractive index for the operating wavelength for which, for example, the lithographic exposure is carried out (also termed spacers 55) are alternatingly applied with layers of a material with a lower real part of the refractive index for the operating wavelength (also termed absorbers 54), an absorber-spacer pair forming a stack 53. To a certain extent, such a structure simulates a crystal whose lattice planes correspond to the absorber layers at which Bragg reflection takes place. The thicknesses of the individual layers 54, 55, as also the repeating stacks 53 can be constant across the entire multilayer system 51, or else vary, depending on which spectral or angle-dependent reflection profile is to be achieved. The reflection profile can also be intentionally influenced by supplementing the basic structure of absorber 54 and spacer 55 by further, more or less absorbent, materials, in order to increase the possible maximum reflectivity for the respective operating wavelength. To this end, it is possible in some stacks to interchange absorber and/or spacer materials with one another, or to construct the stacks from more than one absorber and/or spacer material. The absorber and spacer materials can have thicknesses that are constant or else varied over all the stacks, in order to optimize the reflectivity. Further, it is also possible to provide additional layers as diffusion barriers between spacer and absorber layers 55, 54.

The multilayer system 51 is applied to a substrate 52, and forms a reflective surface 60. Materials with a low coefficient of thermal expansion are preferably selected as substrate materials.

In the embodiment of a reflective optical element 50 illustrated in FIG. 2a, the protective layer system consists of an uppermost layer composed of silicon carbide or ruthenium, having a thickness between 5 nm and 25 nm. In preferred variants, the uppermost layer has a thickness of between 11 nm and 19 nm.

In further embodiments, the protective layer system has under the uppermost layer alternatingly arranged layers composed, on the one hand, of molybdenum or ruthenium and, on the other hand, of carbon, a carbide or a nitride, preferably of a material from the group of silicon carbide, silicon nitride, boron carbide and carbon. Advantageously, in these cases, the protective layer system has a thickness of between 10 nm and 22 nm. Two variants are illustrated by way of example in FIGS. 2b and 2c. In the variant illustrated in FIG. 2b, there is a further layer 57 composed of molybdenum or ruthenium arranged under the uppermost layer 56 of the protective layer system, ruthenium being provided solely in situations in which the uppermost layer 56 is composed of silicon carbide, and thereunder and above the multilayer system 51 a further layer 58 composed of silicon carbide, silicon nitride, boron carbide or carbon. In the case of an uppermost layer 56 composed of silicon carbide the additional layer 58 is advantageously also composed of silicon carbide, in order to keep the outlay for production as low as possible. All known, suitable methods for producing reflective optical elements having a reflective surface with a multilayer system can be employed as production methods here. It may be pointed out that for the case of an uppermost layer 56 composed of ruthenium there is advantageously firstly arranged thereunder a layer 58 composed of silicon carbide, silicon nitride, boron carbide or carbon, or another nitride or carbide and, thereunder, towards the multilayer system 51 a layer 57 composed of molybdenum or ruthenium, in order to obtain a higher reflectivity of the resulting reflective optical element.

Figure 2C:
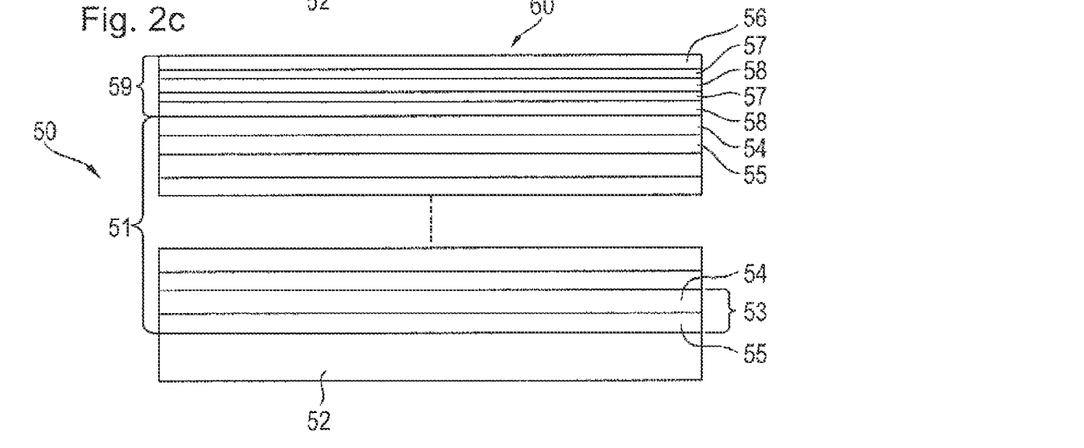

The variant illustrated in FIG. 2c differs from the variant illustrated in FIG. 2b to the effect that there are provided not only two, but four further layers 57 and 58 composed respectively of ruthenium or molybdenum or silicon carbide, silicon nitride, boron carbide or carbon in order simultaneously to improve the protection against high energy reactive hydrogen and to reduce the losses in maximum reflectivity as against a comparable reflective optical element without a protective layer system. Of course, an odd number of additional layers 57, 58 can also be provided in the protective layer system 59 in further variants. Moreover, it is possible to provide not only one, two, three, four, five, but also six, seven, eight, nine or more additional layers 57, 58 under the uppermost layer 56.

It may be pointed out that it is possible to arrange between these layers of the protective layer system 59 additional layers that counteract a mixing of two adjacent layers 56, 57, 58 by taking over the function of a diffusion barrier, for example.

Depending on the selection of the type of the uppermost layer 56, and on the number and type of the further layers 57, 58, the uppermost layer, adjacent to the protective layer system 59, of the multilayer system 51 can be a spacer layer 55 or an absorber layer 54. It is preferred for there to be adjacent to an uppermost absorber layer 54 a layer 58 or 57 of the protective layer system with a higher real part of the refractive index, and for there to be adjacent to an uppermost spacer layer 55 a layer 57 or 58 with a lower real part of the refractive index with respect to the wavelength of which the multilayer system 51 is designed, in order to obtain as high a reflectivity as possible. It is further advantageous when the uppermost layer, adjacent to the protective layer system, of the multilayer system is an absorber layer in order additionally to protect the uppermost spacer layer of the multilayer system against reactive hydrogen, in particular in the case of spacer layers composed of silicon.

In particularly preferred embodiments, the protective layer system under the uppermost layer composed of silicon carbide has alternatingly arranged layers composed of molybdenum and silicon carbide, the protective layer system advantageously having a thickness of between 11 nm and 22 nm.

A plurality of particular embodiments with various protective layer systems were investigated precisely for the intrusion of high energy reactive hydrogen and their reflectivity in the EUV and/or SX wavelength region. The reflective optical elements had a multilayer system based on alternating silicon and molybdenum layers that was optimized for an operating wavelength of 13.5 nm, that is to say they exhibit the maximum reflectivity at substantially normal incidence at 13.5 nm. In this case, the silicon layers correspond to the layers with higher real part of the refractive index at 13.5 nm, and the molybdenum layers correspond to the layers with lower real part of the refractive index at 13.5 nm. In the present example, the multilayer system had a molybdenum layer as uppermost layer.

The maximum reflectivities reached for the individual embodiments were normalized to the maximum reflectivity of the reflective optical element only with a multilayer system without a protective layer system. Moreover, the hydrogen concentration in the respective uppermost silicon layer of the multilayer system was investigated when the respective reflective optical element was exposed to hydrogen with a kinetic energy of 500 eV.

Figure 3:
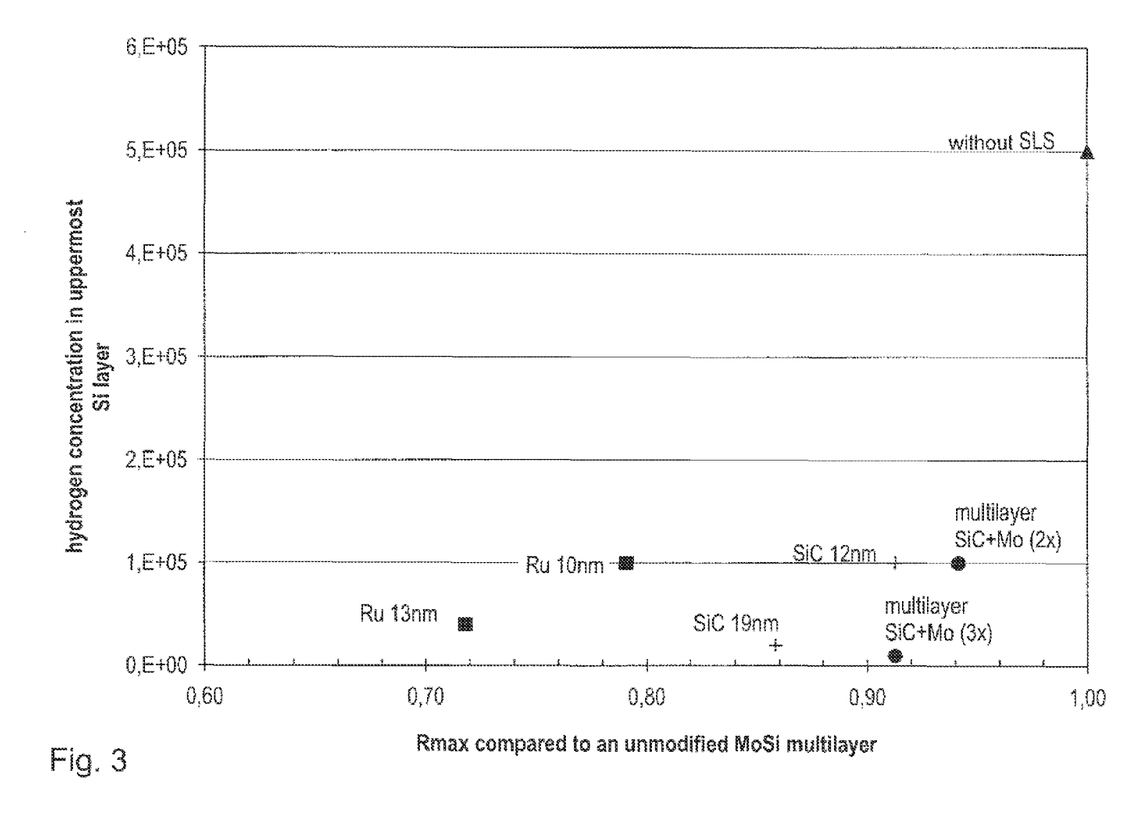
FIG. 3 shows a comparison of hydrogen concentration in the multilayer system and maximum reflectivity for various embodiments of the reflective optical elements.

The result for the reflective optical element without a protective layer system is illustrated in FIG. 3 by the triangle for a relative maximum reflectivity of 1 and a hydrogen concentration in the uppermost silicon layer of 500 000 particles per cubic centimeter, the result being normalized to a surface dose of 1 particle per square centimeter.

The first step was to investigate two reflective optical elements having a single layer protective layer system composed of ruthenium on the molybdenum silicon multilayer system. In this case, one element had an uppermost layer composed of ruthenium with a thickness of 10 nm, and the other element had an uppermost layer composed of ruthenium with a thickness of 13 nm. The respective results are symbolized in FIG. 3 by the squares. For a 10 nm thick ruthenium layer, 100 000 particles of hydrogen were present per cubic centimeter normalized to a surface dose of 1 particle per square centimeter in the uppermost silicon layer of the multilayer system. The maximum reflectivity was, however, only 79% of the maximum reflectivity without the uppermost layer composed of ruthenium. For a 13 nm thick ruthenium layer, the particle concentration was admittedly lowered further to only 40 000 per cubic centimeter normalized to a surface dose of 1 particle per square centimeter. However, the maximum reflectivity was also only 72% of the reflectivity without the protective layer system.

If reflective optical elements with a single layer protective layer system composed of silicon carbide are tested with the aid of an element with a 12 nm thick silicon carbide layer and of an element with a 19 nm thick silicon carbide layer, comparably low hydrogen concentrations are obtained in conjunction with a clearly higher maximum reflectivity. The results are symbolized by the crosses in FIG. 3. For the reflective optical element with an uppermost layers composed of 12 nm silicon carbide on the molybdenum-silicon multilayer system the result was a hydrogen concentration of 100 000 particles per cubic centimeter normalized to a surface dose of 1 particle per square centimeter in the uppermost silicon layer of the multilayer system in conjunction with a relative maximum reflectivity of 91%, while for a silicon carbide thickness of 19 nm the result was a hydrogen concentration of 20 000 particles per cubic centimeter normalized to a surface dose of 1 particle per square centimeter in conjunction with a relative maximum reflectivity of 86%.

Moreover, reflective optical elements with multilayer protective layer systems were investigated. Under an uppermost layer of silicon carbide with a thickness of 4 nm, a first element had a further layer composed of molybdenum with a thickness of 3 nm (corresponding to layer 57 from FIG. 2b), and thereunder a further layer composed of silicon carbide with a thickness of 4 nm (corresponding to layer 58 from FIG. 2b). Under an uppermost layer composed of silicon carbide with a thickness of 4 nm, a second element alternatingly had two further layers composed of molybdenum with a thickness of 3 nm (corresponding to layers 57 from FIG. 2c), and respectively thereunder two further layers composed of silicon carbide with a thickness of 4 nm (corresponding to the layers 58 from FIG. 2b). The molybdenum-silicon multilayer system was likewise located thereunder in both cases. The results of the element with a total of two silicon carbide layers, and for the element with a total of three silicon carbide layers are symbolized in FIG. 3 by the circles. For the element with two silicon carbide layers at a hydrogen concentration of 100 000 per cubic centimeter normalized to a surface dose of 1 particle per square centimeter in the uppermost silicon layer of the multilayer system a relative maximum reflectivity of 94% was reached, while for the element with three silicon carbide layers a hydrogen concentration of 10 000 per cubic centimeter normalized to a surface dose of 1 particle per square centimeter was reached in the case of a relative maximum reflectivity of still 91%

The above description of the preferred embodiments has been given by way of example. From the disclosure given, those skilled in the art will not only understand the present invention and its attendant advantages, but will also find apparent various changes and modifications to the structures disclosed. The applicant seeks, therefore, to cover all such changes and modifications as fall within the spirit and scope of the invention, as defined by the appended claims, and equivalents thereof.

The invention claimed is:
1. An apparatus comprising:
an illumination system for the extreme ultraviolet or soft X-ray wavelength region arranged upstream from a photomask and a projection system, and comprising a collector mirror and at least one downstream mirror arranged downstream from the collector mirror along a radiation path of the illumination system,
wherein the collector mirror is configured to focus and provide radiation to the at least one downstream mirror; and
wherein the collector mirror comprises:
a substrate;
a reflective surface of the collector mirror with a multilayer system comprised of alternatingly arranged layers of a material with a lower real part of the refractive index in the extreme ultraviolet and soft X-ray wavelength region and of a material with a higher real part of the refractive index in the extreme ultraviolet and soft X-ray wavelength region, the material with the higher real part of the refractive index is silicon and the material with the lower real part of the refractive index is molybdenum; and a protective layer system of the collector mirror configured to prevent detachment of layers of the reflective surface and comprising an uppermost layer of the collector mirror composed of silicon carbide, and at least two alternatingly arranged layers composed of, on the one hand, ruthenium and of, on the other hand, a material selected from the group of silicon carbide, silicon nitride, boron carbide and carbon, wherein the reflective surface is arranged on the substrate, wherein the protective layer system is arranged on the reflective surface;

wherein the layer composed of ruthenium is arranged between the uppermost layer of the collector mirror and the layer composed of the material selected from the group of silicon carbide, silicon nitride, boron carbide and carbon, wherein the protective layer system has a thickness of between 5 nm and 25 nm, and wherein the protective layer system does not contain pure silicon.

2. The apparatus according to claim 1, wherein the protective layer system has a thickness of between 10 nm and 22 nm.

3. The apparatus according to claim 1, wherein the at least two alternatingly arranged layers are composed respectively of ruthenium and silicon carbide.

4. The apparatus according to claim 3, wherein the protective layer system has a thickness of between 11 nm and 22 nm.

5. The apparatus of claim 1, wherein the illumination system further comprises an extreme ultraviolet or soft X-ray radiation source, and wherein the collector mirror comprises a first mirror arranged downstream from the radiation source along the radiation path.

6. The apparatus of claim 5, wherein the radiation source is configured to emit radiation in various directions, and wherein the collector mirror is configured to collect the emitted radiation and reflect the collected radiation in focused fashion to a mirror of the illumination system arranged downstream from the collector mirror along the radiation path.

7. The apparatus of claim 5, wherein the radiation source causes tin or tin compounds to be incident on the collector mirror.

8. The apparatus of claim 5, wherein the radiation source causes high energy hydrogen to be incident on the collector mirror.

9. The apparatus of claim 8, wherein the protective layer system is configured to decelerate the high energy hydrogen.

10. An optical system for extreme ultraviolet (EUV) lithography comprising the apparatus according to claim 1.

11. An apparatus comprising:

an illumination system for the extreme ultraviolet or soft X-ray wavelength region arranged upstream from a photomask and a projection system, and comprising a collector mirror and at least one downstream mirror arranged downstream from the collector mirror along a radiation path of the illumination system, wherein the collector mirror is configured to focus and provide radiation to the at least one downstream mirror; and wherein the collector mirror comprises a reflective surface of the collector mirror with a reflective multilayer system, and a protective layer system of the collector mirror arranged on the reflective multilayer system, wherein the protective layer system is configured to prevent detachment of layers of the reflective surface and comprises an uppermost layer of the collector mirror comprised of silicon carbide or ruthenium and at least four additional alternating layers of a first alternating layer and a second alternating layer, wherein the reflective multilayer system comprises alternatingly arranged layers of a material with a lower real part of the refractive index in the extreme ultraviolet and soft X-ray wavelength region and of a material with a higher real part of the refractive index in the extreme ultraviolet and soft X-ray wavelength region, the material with the higher real part of the refractive index is silicon;

wherein the first alternating layer is comprised of ruthenium, wherein the second alternating layer is comprised of a carbon layer, a carbide layer or a nitride layer, and wherein the protective layer system does not contain pure silicon.

12. The apparatus according to claim 11, wherein the reflective multilayer system comprises alternating layers of silicon and molybdenum.

13. The apparatus of claim 11, wherein the illumination system further comprises an extreme ultraviolet or soft X-ray radiation source, and wherein the collector mirror comprises a first mirror arranged downstream from the radiation source along the radiation path.

14. The apparatus of claim 13, wherein the radiation source is configured to emit radiation in various directions, and wherein the collector mirror is configured to collect the emitted radiation and reflect the collected radiation in focused fashion to a mirror of the illumination system arranged downstream from the collector mirror along the radiation path.

15. The apparatus of claim 13, wherein the radiation source causes tin or tin compounds to be incident on the collector mirror.

16. The apparatus of claim 13, wherein the radiation source causes high energy hydrogen to be incident on the collector mirror.

17. The apparatus of claim 16, wherein the protective layer system is configured to decelerate the high energy hydrogen.

* * * * *

UNITED STATES PATENT AND TRADEMARK OFFICE
CERTIFICATE OF CORRECTION

PATENT NO. : 9,996,005 B2  
APPLICATION NO. : 14/082865  
DATED : June 12, 2018  
INVENTOR(S) : Dirk Heinrich Ehm et al.

Page 1 of 1

It is certified that error appears in the above-identified patent and that said Letters Patent is hereby corrected as shown below:

On the Title Page

Column 1, in item (*) Notice:, replace "by 0 days. days." with --by 0 days.--

Signed and Sealed this
Nineteenth Day of February, 2019

Andrei Iancu
*Director of the United States Patent and Trademark Office*